(12) United States Patent
Hirano

(10) Patent No.: US 8,133,820 B2
(45) Date of Patent: Mar. 13, 2012

(54) SUBSTRATE PROCESSING METHOD AND SUBSTRATE PROCESSING APPARATUS

(75) Inventor: Akito Hirano, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 277 days.

(21) Appl. No.: 12/086,285

(22) PCT Filed: Dec. 15, 2006

(86) PCT No.: PCT/JP2006/325021
§ 371 (c)(1),
(2), (4) Date: Sep. 18, 2008

(87) PCT Pub. No.: WO2007/077718
PCT Pub. Date: Jul. 12, 2007

(65) Prior Publication Data
US 2009/0258506 A1   Oct. 15, 2009

(30) Foreign Application Priority Data
Jan. 6, 2006   (JP) .................... 2006-001589

(51) Int. Cl.
H01L 21/31 (2006.01)
(52) U.S. Cl. ................. 438/765; 257/E21.214
(58) Field of Classification Search .......... 438/765, 438/592, 474, 475, 485, 905, 906, 585, 287; 422/186.05; 257/E21.214
See application file for complete search history.

(56) References Cited

U.S. PATENT DOCUMENTS

| 6,379,575 B1 * | 4/2002 | Yin et al. .................. 216/67 |
| 2002/0020433 A1 | 2/2002 | Suemura et al. ............. 134/2 |
| 2005/0170196 A1 * | 8/2005 | Won et al. ................. 428/620 |
| 2006/0110900 A1 * | 5/2006 | Youn et al. ................ 438/592 |

FOREIGN PATENT DOCUMENTS

| JP | 6-267475 | 9/1994 |
| JP | 2000-332245 | 11/2000 |
| JP | 2001-250818 | 9/2001 |
| JP | 2002-176051 | 6/2002 |
| JP | 2002-217168 | 8/2002 |
| JP | 2004-266040 | 9/2004 |
| KR | 2006-55751 | 5/2006 |
| WO | WO 2005/081302 A1 | 9/2005 |

OTHER PUBLICATIONS

Taiwanese Office Action dated Nov. 6, 2009 with English translation.
Korean Office Action dated May 14, 2010 with English translation.
Japanese Office Action mailed Jul. 6, 2010, with English Translation.
Japanese Office Action mailed on Sep. 13, 2011, with English Translation in counterpart JP Application No. 2007-552894.

* cited by examiner

*Primary Examiner* — Thomas L Dickey
*Assistant Examiner* — Nikolay Yushin
(74) *Attorney, Agent, or Firm* — Kratz, Quintos & Hanson, LLP

(57) ABSTRACT

Substrate contamination from tungsten is prevented. A substrate processing method comprises a main treatment process for oxidizing a substrate containing tungsten with a gas containing oxygen, and a cleaning process for removing tungsten oxides with a gas containing hydrogen. The main treatment process includes loading the substrate containing metal into the processing chamber; supplying gas containing oxygen into the processing chamber; and supplying electric power to a high-frequency electric power supply to generate plasma containing oxygen elements, stopping the supply of electric power, and unloading the substrate from the processing chamber. The cleaning process includes supplying gas containing hydrogen into the processing chamber after unloading the substrate; supplying electric power to a high-frequency electric power supply to generate plasma containing hydrogen elements; and stopping the supply of electric power.

12 Claims, 3 Drawing Sheets

SUBSTRATE PROCESSING METHOD AND SUBSTRATE PROCESSING APPARATUS

TECHNICAL FIELD

The present invention relates to a substrate processing method and substrate processing apparatus.

The present invention relates in particular to cleaning technology for the processing chamber in selective oxidation utilizing a MMT (Modified Magnetron Typed) apparatus, and for example, relates to substrate processing methods effective in processes for selectively oxidizing gate structures containing tungsten (atomic symbol W) in methods for manufacturing flash memories that are one type of semiconductor integrated circuit device including semiconductor elements.

BACKGROUND ART

The flash memory for example utilizes a laminated gate structure made from tungsten/polysilicon (poly-Si) in order to lower the resistance of the gate electrode.

Polysilicon for example is used in the floating gate electrode layer, and a metallic material such as tungsten and the compounds is used in the control gate electrode layer.

As this laminated gate structure is made thinner and smaller, the interlayer leak currents can no longer be ignored.

Moreover, the leak current from the side wall can also no longer be ignored as the elements become smaller.

The polysilicon side wall of the laminated gate structure must be oxidized to suppress this leak current and to improve the electric characteristics.

However, when the polysilicon oxidized the side wall, the control electrode layer also becomes oxidized at the same time.

Oxidizing the control electrode layer raises the resistance of the gate electrode, and causes hair shaped crystals called whiskers to pierce through the adjacent film and develop to a point that destroys the semiconductor, causing lower flash memory performance and a lower production yield.

Substrate processing methods were therefore proposed that utilize so-called selective oxidation methods that utilize a gas containing oxygen and hydrogen to oxidize the polysilicon and that do not oxidize the control electrode made from metal. Refer for example to the patent document 1.

Patent Document 1: Japanese Patent Non-Examined Publication No. 2002-176051

DISCLOSURE OF INVENTION

Problem to be Solved by Invention

These selective oxidation methods use plasma containing oxygen and hydrogen in order to selectively oxidize the floating gate layer and the control electrode layer at low temperature.

However, when using plasma to selectively oxidize polysilicon on the laminated gate structure of tungsten/polysilicon, the problem occurs that the interior of the processing chamber becomes contaminated due to tungsten that occurs from etching by the plasma and tungsten that occurs from sublimation of tiny quantities of tungsten oxides.

The present invention therefore has an object of providing a substrate processing method capable of preventing contamination due to tungsten.

SUMMARY OF THE INVENTION

The present invention provides as follows:
a main treatment process for oxidizing a substrate containing tungsten with a gas containing oxygen, and
a cleaning process for removing tungsten oxides with a gas containing hydrogen.

Effect of Invention

The present invention can prevent contamination due to tungsten in the processing chamber that occurs from etching by plasma and that occurs from sublimation of tiny quantities of tungsten oxides, by utilizing gas containing hydrogen to remove tungsten oxides.

BEST MODE FOR CARRYING OUT THE INVENTION

Figure 1:
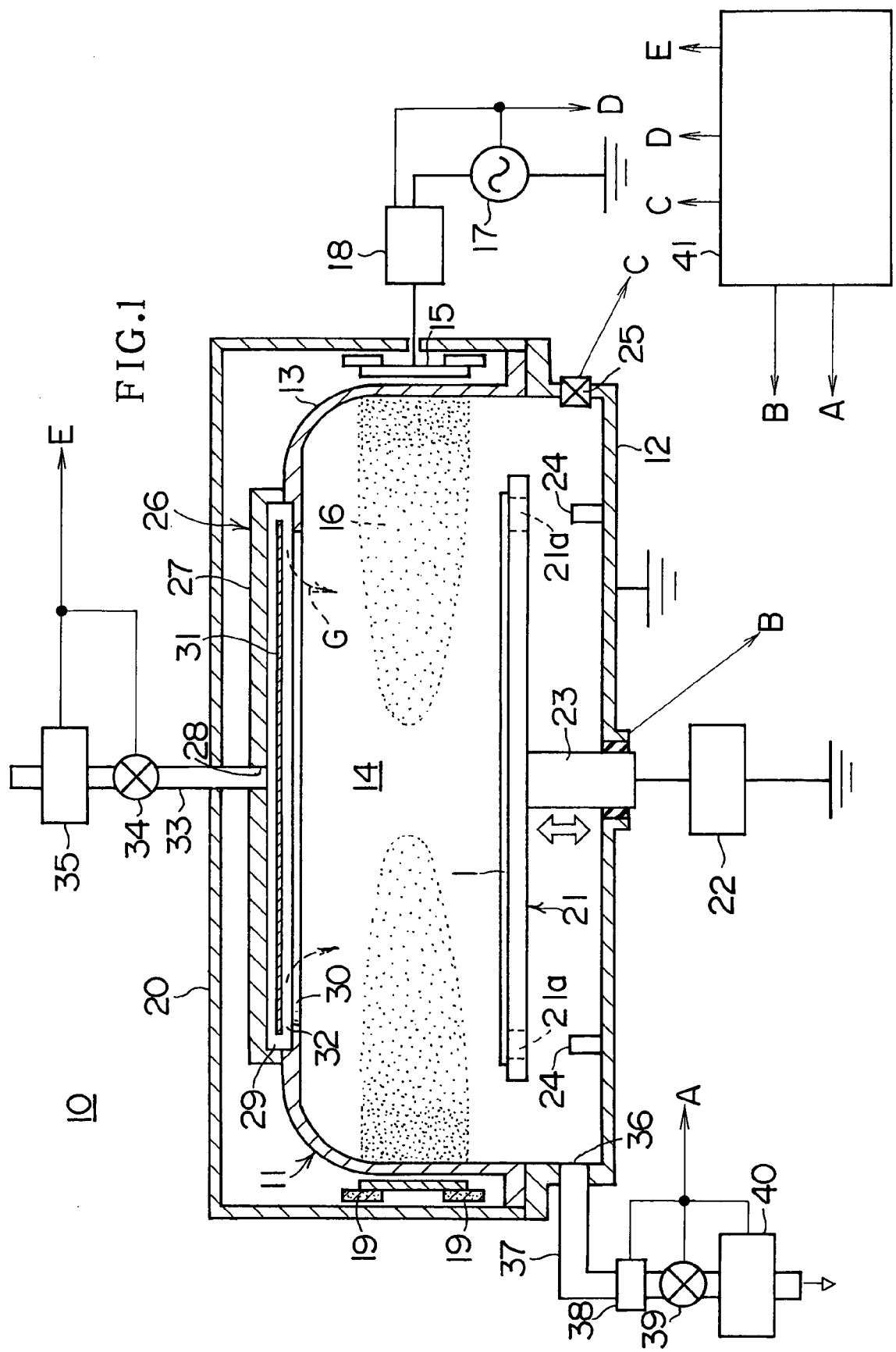
FIG. 1 is a frontal cross sectional view including a control block diagram showing the first embodiment of the present invention.

An embodiment of the present invention is described next while referring to the drawings.

The present embodiment is implemented by an MMT apparatus in a process for selectively oxidizing a laminated gate structure including a floating layer using polysilicon, and a gate electrode layer using tungsten in a method for manufacturing flash memories.

The MMT apparatus is a plasma processing apparatus for plasma processing of substrates such as wafers by utilizing a modified magnetron typed plasma source capable of generating high-density plasma by an electric field and a magnetic field.

In this MMT apparatus, a substrate is placed in a processing chamber maintained in an air-tight state, reaction gas is fed into the processing chamber by way of a shower plate, and while maintaining a fixed pressure in the processing chamber, high-frequency electric power is applied to the discharge electrode to form an electric field, and a magnetic field is applied to start the magnetron discharge.

Electrons emitted from the discharge electrode continue circulating in a cycloid movement while drifting so that ion generation rate is boosted due to the long-life, and therefore a high-density plasma can be generated.

The MMT apparatus in this way can perform different types of plasma processing on the substrate by diffusion processing such as nitriding or oxidizing of the substrate surface by exciting and decomposing the reaction gas, forming a thin film on the substrate surface, and etching the substrate surface.

FIG. 1 shows the MMT apparatus serving as the substrate processing apparatus of the first embodiment of the present invention.

An MMT apparatus 10 shown in FIG. 1 includes a processing container 11. This processing container 11 contains a lower container 12 and an upper container 13 that form a processing chamber 14.

The lower container 12 is formed in a bowl shape from aluminum. The upper container 13 is formed in a dome shape from non-metallic material such as quartz or aluminum oxide. The upper container 13 coves the lower container 12.

A tubular electrode 15 serving as a discharge means to excite the reaction gas is installed on the outer circumference of the upper container 13 of the processing container 11. The tubular electrode 15 encloses a plasma generating region 16 within the processing chamber 14. The tubular electrode 15 is formed in a tubular shape such as a cylinder.

A high-frequency electric power supply 17 applies high-frequency electric power to the tubular electrode 15. The high-frequency electric power supply 17 is connected to the tubular electrode 15 by way of a rectifier 18 for matching the impedance.

A pair of tubular magnets 19, 19 serving as a magnetic field forming part, are respectively installed in the vicinity of the upper and lower edges of the outer surface of the tubular electrode 15. The tubular magnets 19 are formed by permanent magnets in a tubular shape such as a cylinder.

The pair of tubular magnets 19, 19 contain magnetic poles at both ends (inner circumferential end and outer circumferential end) along the radius of the processing chamber 14, and the upper and lower tubular magnets 19, 19 are placed with the poles facing in reverse. The adjacent magnetic poles on the inner circumference are opposite polarities. Therefore, magnetic lines of force are formed along the tubular axis on the inner circumferential surface of the tubular electrode 15.

A shield plate 20 for blocking the magnetic field and the electric field formed by the tubular electrode 15 and the tubular magnets 19 is installed on the periphery of the tubular electrode 15 and the tubular magnets 19. The shield plate 20 prevents the magnetic field and the electric field formed by the tubular electrode 15 and the tubular magnets 19 from exerting adverse effects on equipment such as other substrate processing apparatus and the external environment.

A susceptor 21 serving as the substrate holding unit for holding a wafer 1 serving as the substrate is installed at the bottom center of the processing chamber 14. A heater (not shown in the drawing) functioning as a heating mechanism (heating means) is integrated internally into the susceptor 21. Besides holding the wafer 1, the susceptor 21 is structured to allow heating the wafer 1. In other words, the susceptor 21 is structured as a substrate holding unit incorporating a heater. After being supplied with electric power, the heater is structured to heat the wafer 1 to up to approximately 500° C.

The susceptor 21 is formed for example from non-metallic material such as aluminum nitride or ceramic or quartz. Forming the susceptor 21 from non-metallic material in this way allows to reduce contamination by metals absorbed into the film during the processing.

The interior of the susceptor 21 also contains an impedance electrode (not shown in the drawing) for changing the impedance. The impedance electrode is grounded by way of a variable impedance mechanism 22.

The variable impedance mechanism 22 is made up of a coil and a variable condenser. The control of the number of coil patterns and the variable condenser capacitance value in the variable impedance mechanism 22 allows to regulate the electric potential of the wafer 1 via the impedance electrode and the susceptor 21.

The susceptor 21 is insulated from the lower container 12, and a susceptor elevator mechanism (elevating part) 23 is installed for raising and lowering the susceptor 21.

Through holes 21a are formed in the susceptor 21. Wafer pushup pins 24 are provided in at least three locations on the bottom surface of the lower container 12 for pushing up the wafer 1.

These through holes 21a and wafer pushup pins 24 are positioned so that when the susceptor 21 is lowered by the susceptor elevator mechanism 23, the wafer pushup pins 24 pass through the through holes 21a without contacting the susceptor 21.

A gate valve 25 serving as bulk head is installed on the side wall of the lower container 12.

A transfer mechanism (transfer part) not shown in the drawing carries the wafer 1 in or out of the processing chamber 14 while the gate valve 25 is open. While closed, the gate valve 25 can also close the processing chamber 14 airtight.

A gas head 26 is installed on the upper part of the processing chamber 14. This gas head 26 contains a cap lid 27 and a gas feed port 28 and a buffer chamber 29 and an opening 30 and a shield plate 31 and a gas blow outlet 32. The buffer chamber 29 constitutes a dispersion space for dispersing the gas fed from the gas feed port 28.

A gas supply pipe 33 for supplying gas is connected to the gas feed port 28. The gas supply pipe 33 connects by way of a valve 34 as the opening and closing valve and a mass flow controller 35 serving as the flow rate controller (flow rate control part) to a gas cylinder (not shown in the drawing) for the reaction gas.

A gas exhaust port 36 for exhausting the gas is installed on the side wall of the lower container 12. The gas exhaust port 36 is connected to a gas exhaust pipe 37 for exhausting the gas. The gas exhaust pipe 37 is connected by way of an APC 38 serving as a pressure adjuster, and a valve 39 serving as an opening and closing valve, to a vacuum pump 40 serving as an exhaust device.

The gas exhaust port 36 is set to make the gas supplied from the gas head 26 to the processing chamber 14, flow from around the susceptor 21, towards the bottom of the processing chamber 14.

The MMT apparatus 10 contains a controller 41 as a regulator unit.

The main structure of the controller 41 is as follows.

The controller 41 is structured to control the APC 38, the valve 39 and the vacuum pump 40 by way of a signal line A.

The controller 41 is structured to control the susceptor elevator mechanism 23 by way of a signal line B.

The controller 41 is structured to control the gate valve 25 by way of a signal line C.

The controller 41 is structured to control the rectifier 18 and the high-frequency electric power supply 17 by way of a signal line D.

The controller 41 is structured to control the valve 34 and the mass flow controller 35 by way of a signal line E.

The controller 41 is also structured to control the variable impedance mechanism 22 for the impedance electrode and the heater built into the susceptor 21 by way of a signal line not shown in the drawing.

The controller 41 mainly controls the above units but is not limited to control the above units and performs control relating to the MMT apparatus.

The substrate processing method of an embodiment of the present invention for selective oxidizing of laminated gate structures containing tungsten for flash memories by using the above configured MMT apparatus 10 is described next.

The method of the first embodiment of the present invention for selective oxidizing of laminated gate structures containing tungsten includes a main treatment process for oxidizing a wafer containing tungsten by a gas containing oxygen, and a cleaning process for removing the tungsten oxides by a gas containing hydrogen.

The main treatment process is described first.

The controller 41 regulates the valve 34 and the mass flow controller 35, to supply nitrogen gas or another inert gas into the processing chamber 14; and at the same time regulates the APC 38, the valve 39, and the vacuum pump 40 to exhaust the atmosphere within the processing chamber 14; and adjusts the pressure within the processing chamber 14 to a pressure that was preset for wafer loading.

After adjusting the pressure, a transfer mechanism for transferring the wafer not shown in the drawing carries the wafer 1 from outside the processing chamber 14 into the processing chamber 14, and transfers it on the susceptor 21.

The transferring operation is described next in detail.

The susceptor 21 lowers to the wafer transferring position. The tip of the wafer pushup pin 24 at this time passes through the through hole 21a of the susceptor 21. The pushup pin 24 is in this way protruded to position just the specified height above the surface of the susceptor 21.

Next, the gate valve 25 installed in the lower container 12 then opens.

The transfer mechanism not shown in the drawing then transfers the wafer 1 to the tip of the wafer pushup pin 24.

The gate valve 25 closes when the transfer mechanism retreats to outside the processing chamber 14.

The susceptor elevator mechanism 23 raises the susceptor 21. The wafer 1 is in this way transferred onto the upper surface of the susceptor 21.

With the wafer 1 transferred, and the gate valve 25 closed, the controller 41 stops the supply of nitrogen gas, and regulates the vacuum pump 40 and the APC 38 to exhaust the atmosphere within the processing chamber 14.

After the gate valve 25 has closed, the susceptor elevator mechanism 23 raises the susceptor 21 up to the position for processing the wafer 1.

The operation to raise the susceptor 21 may be performed while exhausting the processing chamber 14 or may be performed before or afterwards.

The heater built into the susceptor 21 is preheated. The heater heats the wafer 1 transferred onto the susceptor 21, to a specified temperature in a range from room temperature to 700° C.

The vacuum pump 40 and the APC 38 maintain the pressure within the processing chamber 14 at a specified pressure within a range from 0.1 to 100 Pa.

When the temperature of the wafer 1 reaches the specified processing temperature (for example, 400° C.) and stabilizes, the hydrogen gas and oxygen gas are supplied as a reaction gas G from the gas feed port 28 by way of the gas blow outlet 32 of the shield plate 31, towards the upper surface (processing surface) of the wafer 1 positioned in the processing chamber 14.

The flow ratio (hydrogen gas/oxygen gas) of hydrogen gas to oxygen gas serving as the reaction gas is regulated to 8 or more in the step of selectively oxidizing a laminated gate structure using tungsten.

The flow rate controller units for each gas not shown in the drawing regulate the flow of hydrogen gas and oxygen gas beforehand, in order to set a flow rate of 8 or more. The flow rate controller units for each gas for example regulate the flow of hydrogen gas to 356 sccm and the flow of oxygen gas to 44 sccm.

The reason for setting the flow ratio of hydrogen gas to oxygen gas to a rich hydrogen of 8 or more is because a mixture below this ratio (percentage of oxygen is larger) makes selective oxidizing in the tungsten and polysilicon impossible.

Increasing the percentage of hydrogen gas boosts the reduction effect so that oxidizing of the tungsten surface can be suppressed to an even greater degree.

Conversely, increasing the percentage of hydrogen gas lowers the oxidizing rate of the polysilicon.

In other words, the flow ratio of hydrogen gas to oxygen gas is preferably set to exceed 8 if the drop in the oxidizing rate is within an allowable range.

The hydrogen gas can here be diluted compared to the case where supplying only hydrogen gas, so that the explode of the hydrogen gas can be inhibited with an inexpensive structure.

The high-frequency electric power supply 17 on the other hand, applies high-frequency electric power to the tubular electrode 15 by way of the rectifier 18. The electric power to be applied is a specified output within a range of 150 to 500 watts. The variable impedance mechanism 22 is controlled to reach the pre-specified impedance value.

The effect from the magnetic field of the tubular magnets 19, 19 causes a magnetron discharge, electric charges are then trapped in the space above the wafer 1 and high-density plasma is generated in the plasma generating region 16.

The oxygen gas and the hydrogen gas fed as the reaction gas G into the processing chamber 14 dissociate in the plasma generating region 16, and generate H (hydrogen atoms) and OH (hydroxyl) etc.

The OH acts on the polysilicon and tungsten to oxidize each film. The H has a reduction effect on the tungsten and reduces the oxidized tungsten film effectively. The reduction effect that H exerts on polysilicon is weak so that virtually no reduction occurs on the polysilicon film.

Consequently, the polysilicon film is oxidized but the tungsten film is not oxidized. In other words, the polysilicon film is selectively oxidized.

When the pre-set processing time has elapsed, the controller 41 lowers the electric power applied to the tubular magnets 19, 19 in steps so that the discharge gradually weakens.

Suddenly stopping the supply of electric power causes the wafer 1 to become electrified, and the wafer 1 might be adsorbed on the susceptor 21. In that case, picking up the wafer 1 from the susceptor might be difficult in unloading of the wafer 1. Unloading of the wafer 1 might then be delayed or the wafer 1 might become cracked from excessive force being used to pick up the wafer 1.

In order to prevent these phenomena from occurring, the discharge must be weakened in stages to minimize the electrification on the wafer 1 before ending the processing.

The valve 34 is closed, and along with stopping the supply of oxygen gas and hydrogen gas from the gas blow outlet 32, the application of high-frequency electric power to the tubular electrode 15 is stopped.

Next, the controller 41 regulates the valve 34 and the mass flow controller 35, to supply nitrogen gas or another inert gas into the processing chamber 14; and at the same time regulates the APC 38, valve 39, and the vacuum pump 40 to exhaust the atmosphere within the processing chamber 14; and adjusts the pressure within the processing chamber 14 to a pressure that was pre-set for wafer loading.

After the pressure within the processing chamber 14 has been set to the same pressure as the vacuum transfer chamber (not shown in the drawing) serving as the chamber to install the transfer mechanism, the processed wafer 1 is transferred outside the processing chamber 14 in a procedure that is the reverse of the above described wafer loading procedure.

The cleaning process is described next.

Incidentally, the above described main treatment process of performing the selective oxidation, can inhibit sublimation of the tungsten oxides due to the reduction effect of hydrogen and so can reduce the tungsten contamination within the processing chamber 14.

However, tungsten gradually accumulates inside the processing chamber 14 due to tungsten that occurs from sublimation of tiny quantities of tungsten oxides and tungsten that occurs from etching by the plasma as the main treatment process for selectively oxidizing the laminated gate structure is repeated over and over.

Therefore, in the present embodiment, the cleaning process within the processing chamber 14 is performed periodically or intermittently.

The cleaning process is performed in a state where the wafer 1 was unloaded from the interior of the processing chamber 14.

In this cleaning process, the inside of the processing chamber 41 is heated to a specified cleaning temperature (for example, 400° C.).

When the temperature inside the processing chamber 14 reaches the specified temperature and stabilizes, hydrogen gas and oxygen gas are fed as the cleaning gas from the gas feed port 28 by way of the gas blow port 32 of the shield plate 31 into the processing chamber 14.

After the supplying of the gas, the controller 41 regulates the valve 34 and the mass flow controller 35, to supply oxygen gas and hydrogen gas into the processing chamber 14; and at the same time regulates the APC 38, the valve 39, and the vacuum pump 40 to exhaust the atmosphere within the processing chamber 14; and adjusts the pressure within the processing chamber 14 to a pressure (for example 100 Pa) that was preset for cleaning.

In this cleaning process, the flow ratio (hydrogen gas/oxygen gas) of hydrogen gas to oxygen gas serving as the cleaning gas is controlled to be 2 or more.

High frequency electric power is applied from the high-frequency electric power supply 17 by way of the rectifier 18 to the tubular electrode 15. The electric power is applied at a specified output value (for example, 150 watts) within a specified range from 150 to 500 watts.

The oxygen gas and hydrogen gas supplied into the processing chamber 14 as the cleaning gas, dissociate in the processing chamber 14 and generate H and OH, etc.

The H has a reduction effect on the tungsten and reduces the tungsten oxides accumulated inside the processing chamber 14 to return tungsten. The exhaust force of the vacuum pump 40 efficiently discharges this tungsten from the processing chamber 14.

The hydrogen ions stir up the tungsten attached to the inside of the processing chamber 14, and the exhaust force of the vacuum pump 40 efficiently discharges the tungsten from the processing chamber 14.

Tungsten that was not driven out is oxidized by the OH and sublimated into tungsten oxide. These sublimated tungsten oxides are returned to tungsten by a reducing reaction with H and so are efficiently discharged from the processing chamber 14 by the exhaust force of the vacuum pump 40.

The polysilicon deposits in the processing chamber 14 are oxidized by the OH and so are efficiently discharged from the processing chamber 14 by the exhaust force of the vacuum pump 40.

Polysilicon is not a cause of metal contamination in the processing chamber 14 but when the polysilicon deposits increase to a certain thickness, these deposits peel off and become a source of particle emissions and therefore require cleaning.

After the cleaning process ends, the controller 41 stops the supply of electric power to the tubular magnets 19, 19 to stop the discharge.

Next, the vacuum pump 40 exhausts the atmosphere within the processing chamber 14. Exhausting the processing chamber 14 here ensures that metallic substances such as tungsten not exhausted during the plasma processing are lowered to a range not affecting the wafer 1.

The above embodiment renders the following effects.

1) Contamination on the wafer due to tungsten can be prevented because the cleaning process utilizes gas containing hydrogen to remove tungsten oxides inside the processing chamber in a state where the wafer was unloaded, after performing the main treatment process that utilizes gas containing oxygen to oxidize the wafer containing tungsten, so that a high level of purity versus tungsten can be maintained within the processing chamber.

2) Tungsten and tungsten oxides can be efficiently cleaned away because hydrogen gas and oxygen gas are utilized as the cleaning gas, and setting the flow ratio of hydrogen gas to oxygen gas to 2 or more allows utilizing the reducing reaction and oxidizing reaction of the H and OH.

3) The polysilicon alone can be reliably oxidized since in selective oxidizing of polysilicon of the laminated gate structure using tungsten, hydrogen gas and oxygen gas are utilized as the reaction gas, and the flow ratio of hydrogen gas to oxygen gas is regulated to be 8 or more which makes the polysilicon easier to oxidize than the tungsten.

4) The polysilicon alone can be reliably oxidized because the flow ratio of hydrogen gas to oxygen gas can be regulated to be 8 or more in selective oxidizing of polysilicon of the laminated gate structure using tungsten since the MMT apparatus possesses the excellent characteristic that there is no drop in the oxidizing rate even if the flow ratio of hydrogen gas to oxygen gas is raised (even if the percentage of hydrogen gas is raised).

5) Productivity can be improved because of energy saving, and thermal damage to the product such as flash memories can be lessened since utilizing the MMT apparatus allows selectively oxidizing polysilicon of the laminated gate structure containing tungsten/polysilicon at comparatively low temperatures.

Figure 2:
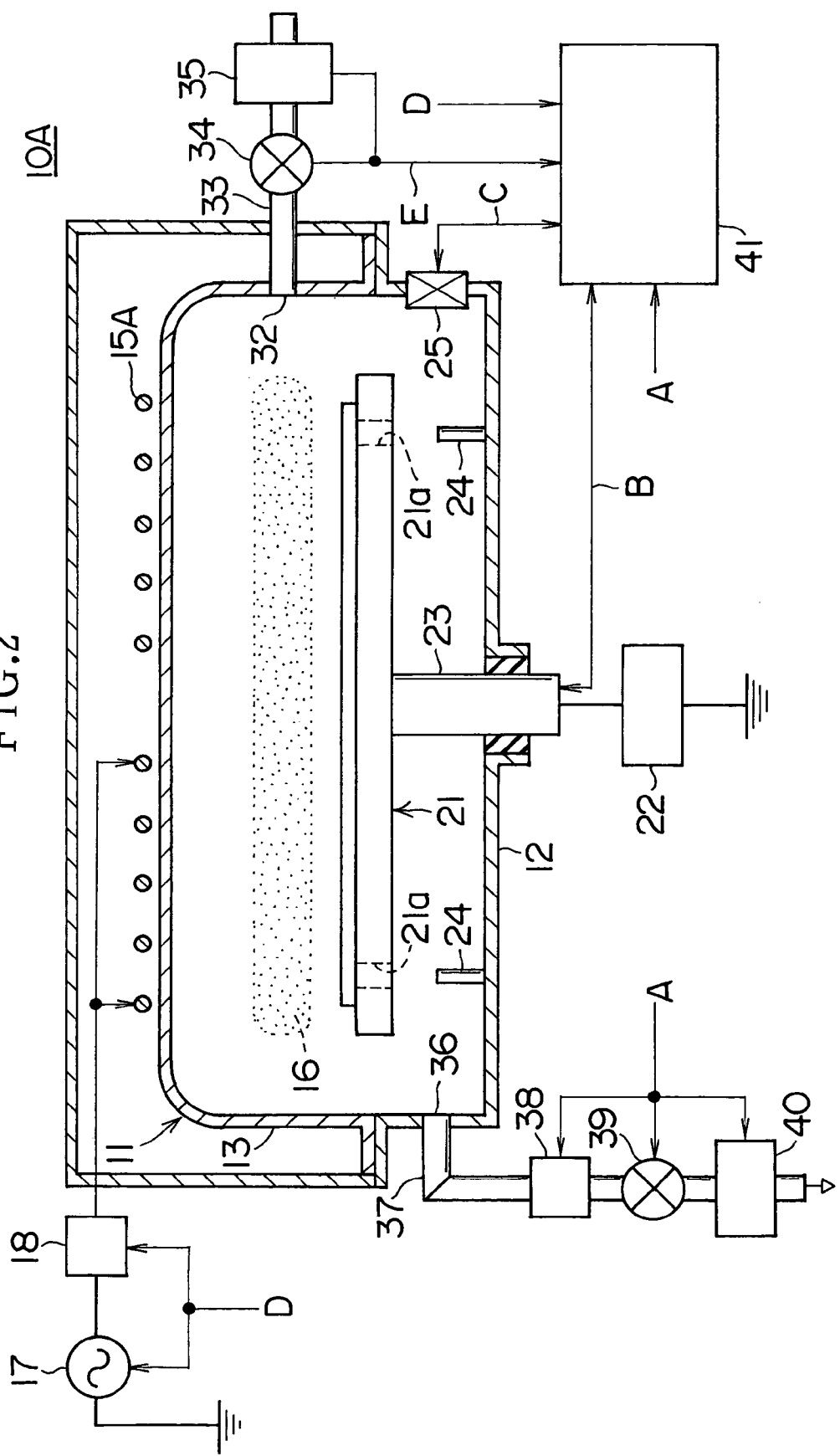
FIG. 2 is a frontal cross sectional view including a control block diagram showing the second embodiment of the present invention.

FIG. 2 is a drawing showing an ICP type plasma processing apparatus serving as the substrate processing apparatus of the second embodiment of the present invention.

In the detailed description of the present embodiment, those structural components performing the same functions as the previous embodiment are assigned the same reference numerals.

An ICP (Inductively Coupled Plasma) type plasma processing apparatus 10A of this embodiment contains an inductive coil 15A as a plasma generating unit for supplying electric power to generate plasma. This inductive coil 15A is installed on the outer side of the ceiling wall of the processing container 11.

The present embodiment can generate plasma containing oxygen elements and plasma containing hydrogen elements in the plasma generating region 16 and therefore renders the same effect and function of the first embodiment.

Figure 3:
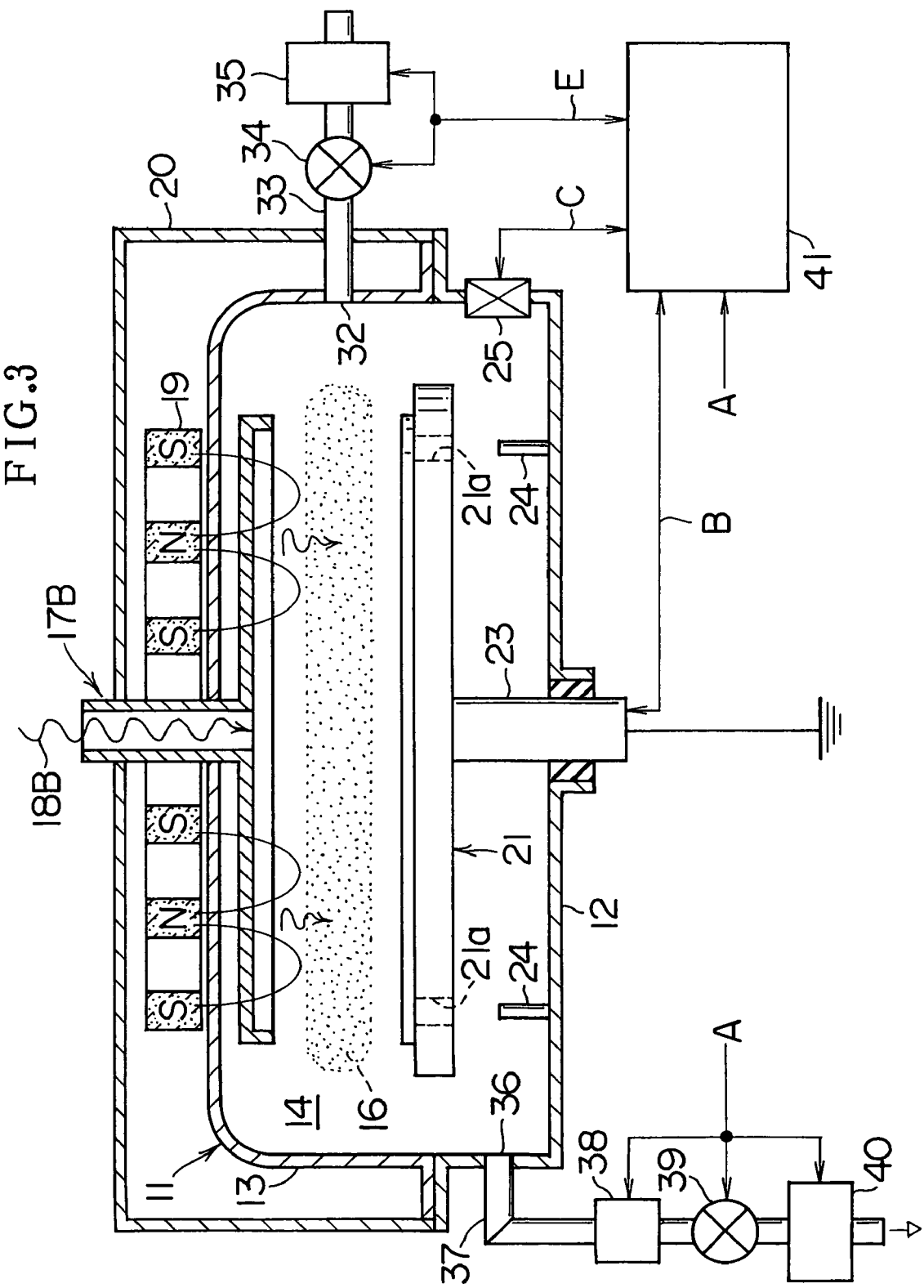
FIG. 3 is a frontal cross sectional view including a control block diagram showing the third embodiment of the present invention.

FIG. 3 shows an ECR type plasma processing apparatus serving as the substrate processing apparatus of the third embodiment of the present invention.

In the detailed description of the present embodiment, those structural components performing the same functions as the first embodiment are assigned the same reference numerals.

An ECR (Electron Cyclotron Resonance) type plasma processing apparatus 10B of this embodiment contains a microwave guide tube 17B serving as the plasma generating unit for supplying electric power to generate plasma. This microwave guide tube 17B is structured to supply microwaves 18B into the entire plasma generating region 16 within the processing chamber 11 from above.

The present embodiment is also capable of generating plasma containing oxygen elements and plasma containing hydrogen elements in the plasma generating region 16 and therefore renders the same effect and function of the first embodiment.

The present invention is not limited by the above embodiments, and needless to say, various adaptations and changes not departing from the spirit and scope of the present invention are permitted.

For example, the plasma processing apparatus is not limited to an MMT apparatus, an ICP type plasma processing apparatus, or an ECR type plasma processing apparatus, and may utilize other plasma processing apparatus.

The gas containing oxygen in the process for oxidizing the wafer containing tungsten is not limited to use of a mixed gas of hydrogen gas and oxygen gas, and for example nitrous oxide ($N_2O$) gas or nitric oxide (NO) gas may be utilized.

The gas containing hydrogen in the cleaning process for removing tungsten oxides is not limited to use of a mixed gas of hydrogen gas and oxygen gas, and a hydrogen gas alone or a mixed gas of hydrogen gas and silane type gas may for example be used.

To achieve a high throughput, the cleaning process is preferably performed after the main treatment process has been repeated multiple times.

Further preferred aspects are related next.

(1) A substrate processing method comprising:
a main treatment process for oxidizing a substrate containing tungsten with a gas containing oxygen, and
a cleaning process for removing tungsten oxides with a gas containing hydrogen.

(2) A substrate processing method according to the first (1) aspect, wherein the cleaning process is performed after the main treatment process was performed a specified number of times.

A high quality substrate with no metal contamination can in this way be manufactured with higher throughput even during continuous processing of substrates.

(3) A substrate processing method comprising:
a main treatment process including a step of loading a substrate containing metal into a processing chamber; a step of supplying gas containing oxygen into the processing chamber; a step of supplying electric power to a high-frequency electric power supply after supplying the gas, to generate plasma containing oxygen elements in order to process the substrate; a step of stopping the supply of electric power to the high-frequency electric power supply; and a step of unloading the substrate from the processing chamber, and
a cleaning process including a step of supplying gas containing hydrogen into the processing chamber after unloading the substrate; a step of supplying electric power to a high-frequency electric power supply after supplying the gas containing hydrogen, to generate plasma containing hydrogen elements in order to perform cleaning; and a step of stopping the supply of electric power to the high-frequency electric power supply.

(4) A substrate processing method according to the third (3) aspect, wherein in the main treatment process, the electric power is stopped in steps when stopping the supply of electric power to the high-frequency electric power supply.

Stopping the electric power in steps, to gradually weaken the discharge, can inhibit electrification on the wafer, and prevent the wafer from being adsorbed on the susceptor. The substrate can in this way be prevented from breaking during transferring the wafer after processing and moreover good unloading of the substrate can be ensured.

(5) A substrate processing method according to the fourth (4) aspect, wherein the gas within the processing chamber is exhausted after the cleaning process.

Particles such as metallic elements generated in the cleaning process can in this way be exhausted, and metal contamination can be suppressed in the next substrate processing process.

(6) A substrate processing apparatus comprising:
a gas supply unit for supplying gas into a processing chamber,
a plasma generating unit for supplying electric power to generate plasma,
a substrate holding unit for holding a substrate,
an exhaust unit for exhausting the interior of the processing chamber, and
a control unit for controlling of supplying gas containing oxygen into the processing chamber after the substrate was loaded into the substrate holding unit, to generate plasma containing oxygen elements in order to process the substrate; stopping the generation of plasma; performing a main treatment process on the substrate in the processing chamber; and then supplying gas containing hydrogen into the processing chamber, to generate plasma containing hydrogen elements in order to perform a cleaning process.

The cleaning process can in this way be implemented after the main treatment process so that a high degree of purity versus tungsten can be maintained in the processing chamber, and consequently contamination of the wafer by tungsten can be prevented beforehand.

The invention claimed is:

1. A substrate processing method comprising:
a main treatment process for loading a substrate containing a laminated gate structure having tungsten and silicon into a processing chamber and oxidizing the substrate with a gas containing oxygen in the processing chamber,
an unloading process for unloading the substrate from the processing chamber, and
a cleaning process for removing tungsten oxides from the inside of the chamber with a gas containing hydrogen after the unloading process.

2. A substrate processing method according to claim 1, wherein the cleaning process is performed after the main treatment process was performed a specified number of times.

3. A substrate processing method comprising:
a main treatment process including a step of loading a substrate containing a laminated gate structure having tungsten and silicon into a processing chamber; a step of supplying gas containing oxygen into the processing chamber; a step of supplying electric power to a high-frequency electric power supply after supplying the gas, to generate plasma containing oxygen elements in order to process the substrate; a step of stopping the supply of electric power to the high-frequency electric power supply; and a step of unloading the substrate from the processing chamber, and
a cleaning process including a step of supplying gas containing hydrogen and gas containing oxygen into the processing chamber after unloading the substrate; a step of supplying electric power to a high-frequency electric power supply after supplying the gas containing hydrogen and the gas containing oxygen, to generate plasma containing hydrogen elements and oxygen elements in order to perform cleaning; and a step of stopping the supply of electric power to the high-frequency electric power supply.

4. A substrate processing method according to claim 3, wherein in the main treatment process, the electric power is stopped in steps when stopping the supply of electric power to the high-frequency electric power supply.

5. A substrate processing method according to claim 4, wherein the gas within the processing chamber is exhausted after the cleaning process.

6. A substrate processing apparatus comprising:
a gas supply unit for supplying gas into a processing chamber,
a plasma generating unit for supplying electric power to generate plasma,
a substrate holding unit for holding a substrate containing a laminated gate structure having tungsten and silicon,
an exhaust unit for exhausting the interior of the processing chamber, and
a control unit for controlling of performing a main treatment process including a step of loading the substrate into the processing chamber; a step of supplying gas containing oxygen into the processing chamber; a step of supplying electric power to a high-frequency electric power supply after supplying the gas, to generate plasma containing oxygen elements in order to process the substrate; a step of stopping the supply of electric power to the high-frequency electric power supply; and a step of unloading the substrate from the processing chamber, and performing a cleaning process including a step of supplying gas containing hydrogen and gas containing oxygen into the processing chamber after unloading the substrate; a step of supplying electric power to a high-frequency electric power supply after supplying the gas containing hydrogen and the gas containing oxygen, to generate plasma containing hydrogen elements and oxygen elements in order to perform cleaning; and a step of stopping the supply of electric power to the high-frequency electric power supply.

7. A substrate processing method according to claim 1, wherein in the main treatment process, gas containing hydrogen is supplied into the processing chamber.

8. A substrate processing method according to claim 7, wherein in the main treatment process, the flow ratio of gas containing hydrogen to gas containing oxygen is regulated to be 8 or more.

9. A substrate processing method according to claim 3, comprising a step of supplying gas containing hydrogen before supplying electric power to a high-frequency electric power supply, and a step of generating plasma containing hydrogen elements.

10. A substrate processing method according to claim 9, wherein in the main treatment process, the flow ratio of gas containing hydrogen to gas containing oxygen is regulated to be 8 or more.

11. A substrate processing apparatus according to claim 6, wherein the control unit controls the gas supply unit and the plasma generating unit to supply gas containing hydrogen before supplying electric power to a high-frequency electric power supply and to generate plasma containing hydrogen elements.

12. A substrate processing apparatus according to claim 11, wherein in the main treatment process, the flow ratio of gas containing hydrogen to gas containing oxygen is regulated to be 8 or more.

* * * * *